United States Patent [19]
You et al.

[11] Patent Number: 5,268,202
[45] Date of Patent: Dec. 7, 1993

[54] VAPOR DEPOSITION OF PARYLENE-F USING 1,4-BIS (TRIFLUOROMETHYL) BENZENE

[75] Inventors: Lu You; Guang-Rong Yang, both of Troy; Toh-Ming Lu, Loudonville; James A. Moore, Wynantskill; John F. P. McDonald, Clifton Park, all of N.Y.

[73] Assignee: Rensselaer Polytechnic Institute, Troy, N.Y.

[21] Appl. No.: 960,089

[22] Filed: Oct. 9, 1992

[51] Int. Cl.$^5$ ............................................. C23C 16/00
[52] U.S. Cl. ............................. 427/255.6; 427/255.1; 427/255.2; 427/248.1
[58] Field of Search ............... 427/255.6, 255.1, 255.2, 427/248.1

[56] References Cited

U.S. PATENT DOCUMENTS

| | | |
|---|---|---|
| 4,518,623 | 5/1985 | Riley ........................................ 427/8 |
| 5,078,091 | 1/1992 | Stewart ................................ 118/719 |

OTHER PUBLICATIONS

Chow et al., "Poly ($\alpha,\alpha,\alpha',\alpha'$-tetrafluoro-p-xylylene)," Journal of Applied Polymer Science, vol. 13 (1969), pp. 2325-2332.
Gorham, "A New, General Synthetic Method for the Preparation of Linear Poly-p-xylylenes," Journal of Polymer Science: Part A-1, vol. 1 (1966), pp. 3027-3039.
Chow et al., "The Synthese of 1,1,2,2,9,9,10,10-Octafluoro [2.2] paracylophane," The Journal of Organic Chemistry, vol. 35, (Jan. 1970) pp. 20-22.
Hertler, "Substituted Quinodimethans. VI. 7,7,8,8-Tetrafluoroquinodimethan Polymer," The Journal of Organic Chemistry, vol. 28 (Oct. 1963), pp. 2877-2879.

*Primary Examiner*—Roy King
*Attorney, Agent, or Firm*—Heslin & Rothenberg

[57] ABSTRACT

A PA-F polymer film is formed using a mixture of 1,4-bis (trifluoromethyl) benzene (TFB) and a halogen initiator. This mixture is provided to a low pressure reactor containing a metal catalyst. The reactor is operated at a sufficient temperature to form a reactive monomer by a chemical reaction at the surface of the catalyst. The reactive monomer is condensed on the surface of a substrate cooled to a temperature sufficiently low to induce polymerization of the reactive monomer to form a PA-F polymer film. In general, the proportion of halogen initiator is about 0.25 to 50% by volume relative to the total volume of the TFB/halogen initiator mixture. The reactor is operated at a temperature of about 200° to 700° C. and a pressure of less than about one torr. In addition, the surface of the substrate is maintained at a temperature of about −30° C. to room temperature. In the preferred approach, the halogen initiator is dibromotetrafluoro-p-xylene (DBX) and the proportion of DBX is about 1 to 5%.

22 Claims, 1 Drawing Sheet

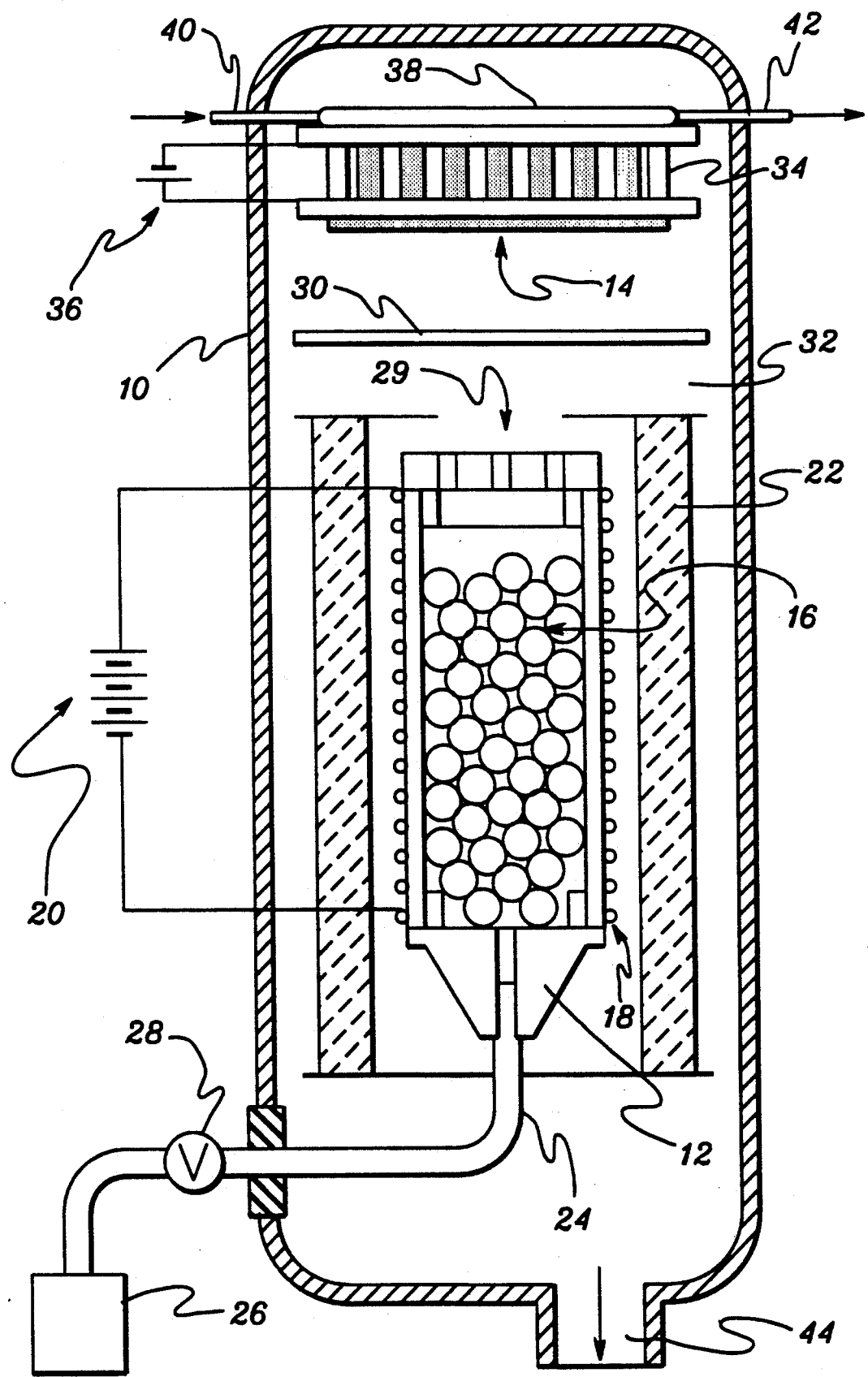

VAPOR DEPOSITION OF PARYLENE-F USING 1,4-BIS (TRIFLUOROMETHYL) BENZENE

FIELD OF THE INVENTION

The present invention relates generally to the formation of fluorinated polymers and, in particular, to the deposition of PA-F using 1,4-bis (trifluoromethyl) benzene (TFB) as a precursor.

DESCRIPTION OF THE PRIOR ART

As the operation frequency of electronic devices used in integrated circuits enters the GHz regime, low RC constants for interconnections in the integrated circuits becomes more important than the intrinsic, or unloaded, speeds of the devices themselves. Also, as the dimensions of electronic devices approach submicron levels, dielectric media with lower dielectric constants are essential to the reduction of signal couplings between data connections used in the integrated circuits. Likewise, dielectric media with lower dielectric constants are necessary for the multi-chip module (MCM) or wafer-scale hybrid interconnection and packaging techniques used to further densify VLSI circuits. As a result of the above, the dielectric material selected for packaging and interconnection in a VLSI circuit significantly affects its speed, performance, design, and reliability. One group of dielectric materials having superior material properties and low dielectric constants for use in packaging and interconnection in VLSI circuits is parylene (poly-p-xylylene) and its derivatives.

Parylenes (PAs), depending on the type, have dielectric constants of 2.35 to 3.15 and have small water absorption coefficients of, for example, 0.06% by weight over a time period of 24 hours. In contrast, polyimides (PI's), which are commonly used in VLSI circuits, have higher dielectric constants and higher water absorption coefficients (often 1-5% by weight).

An important advantage of PAs is that they may be deposited with the substrate by vapor deposition (some types of PAs may be vapor deposited at about or above room temperature). Vapor deposition permits the deposition of PA films that conform well to the micron and submicron topography found in integrated circuits (for example, vias found in VLSI circuits). Another advantage of vapor deposition is that the deposited PA films exhibit no significant solvent contamination and do not require temperature curing. Therefore, vapor-deposited PA films exhibit a lower intrinsic stress.

The use of PAs is not limited to VLSI circuits. For example, other applications using PAs include medical technology, fusion targets, artifact conservation, contamination and corrosion control, dry lubrication, and thin protective coatings for increasing reliability without hermeticity.

The parylene family is composed of five different types of polymers: parylene-N (PA-N), parylene-C (PA-C), parylene-D (PA-D), parylene-E (PA-E) and parylene-F (PA-F). All of these types, with the exception of PA-F, are commercially available. In general, the diffusion and adhesion characteristics of metals to polymer films, polymer film stress, and the thermal stability of the polymer film depend strongly on the melting temperature of the polymer. PA-N has the highest melting temperature and the lowest dielectric constant among the unfluorinated parylenes. However, because the melting temperature of PA-N is only about 420° C., its use in VLSI circuits requires low-temperature processing steps.

Fluorinated parylene (PA-F) has a higher melting temperature and a lower dielectric constant than unfluorinated parylenes such as PA-N. The reported melting temperature of PA-F is 530° C., one hundred and ten degrees higher than that of PA-N. The dielectric constant of PA-F is 2.35 at 1 MHz, which is one of the lowest dielectric constants among known polymers. Two other polymers, PTFE, poly(tetrafluoro-ethylene) and a DuPont derivative Teflon-AF, have lower dielectric constants, but these materials exhibit adhesion problems, lower thermal stability, and in some cases mechanical creep.

The conventional fabrication process for PA-F is difficult, involves many process steps, and is more expensive than that for PA-N. Typically, this process first involves the formation of a PA-F dimer (1,1,2,2,9,9,10,10-octafluoro[2.2]paracyclophane). One method for making this dimer has been reported by Chow et al., Journal of Organic Chemistry, vol. 35, no. 1, January 1970, pp. 20–22, which is hereby incorporated in full by reference. As shown by Chow et al., $\alpha$, $\alpha'$-bis(alkylsufonyl)-$\alpha$, $\alpha$, $\alpha'$, $\alpha$-tetrafluoro-p-xylene (I) and $\alpha$, $\alpha'$-dihalo-$\alpha$, $\alpha$, $\alpha'$, $\alpha'$-tetrafluro-p-xylene (II) are used as precursors for the dimer formation. The pyrolysis of (I) is conducted in steam at 600° to 800° C., and the reaction products are collected in an organic solvent such as toluene. The PA-F dimer is then isolated and purified from the solvent by evaporation, recrystallization, and sublimation.

Using the PA-F dimer obtained, a PA-F polymer film is produced using the standard Gorham method. According to the Gorham method reported by Chow et al., Journal of Applied Polymer Science, vol. 13 (1969), pp. 2325–2332, which is incorporated in full by reference, the PA-F dimers are cracked at about 720° to 730° C. to produce a large amount of monomer ($\alpha$, $\alpha$, $\alpha'$, $\alpha'$-tetrafluoro-p-xylylene). These monomer molecules are very reactive, and are easily condensed onto a substrate at −25° to −35° C., where polymerization of the PA-F film occurs.

As described above, the large number of processing steps required to form PA-F using the cracking of a PA-F dimer by the Gorham method is difficult, time-consuming, and expensive. In addition, the precursors required by this process are not commercially available and are, therefore, more expensive. Further, the large number of steps required leads to a low overall yield.

Thus, there is a need for a simpler process for making PA-F that is less time-consuming, results in higher yields, and uses less-expensive precursors.

SUMMARY OF THE INVENTION

This need is satisfied, the limitations of the prior art overcome, and other benefits realized in accordance with the principles of the present invention by a process for forming a PA-F polymer. According to this process, a mixture of 1,4-bis(trifluoromethyl)benzene and a halogen initiator are provided to a low pressure reactor containing a metal catalyst. The reactor is operated at a sufficient temperature to form a reactive monomer by a chemical reaction at the surface of the catalyst. The reactive monomer is condensed on the surface of a substrate cooled to a temperature sufficient to induce polymerization of the reactive monomer to form a PA-F polymer film.

In general, the proportion of halogen initiator is about 0.25 to 50% by volume relative to the total volume of the TFB/halogen initiator mixture. The reactor is operated at a temperature of about 200° to 700° C. and a pressure of less than about one torr. In addition, the surface of the substrate is maintained at a temperature of about −30° C. to room temperature.

In the preferred embodiment, the halogen initiator is dibromotetrafluoro-p-xylene (DBX) and the proportion of DBX is about 1 to 5% by volume relative to the total volume of the TFB/DBX mixture. The reactor is operated at a temperature of about 350° to 400° C. and a pressure of about 50 to 450 mtorr and contains a copper catalyst. The surface of the substrate is maintained at a temperature of about −15° to −5° C. The PA-F films formed have a thickness of, for example, about 0.2 to 2 microns An advantage of the present invention is that it uses a precursor, TFB, that is commercially available. Another advantage is that the process for forming PA-F is simpler and less time-consuming than the conventional method using a PA-F dimer. Thus, overall yields of PA-F will be higher. Further, the PA-F films formed by the present invention have lower concentrations of certain impurities such as water, oxygen, hydrogen than films formed by the conventional method owing to the steam and other reactant groups such as $\alpha,\alpha$-bis(alkysulfonyl).

The foregoing and other objects, features, and advantages of the invention will be apparent from the following more particular description of a preferred embodiment of the invention, as illustrated in the accompanying drawing.

BRIEF DESCRIPTION OF THE DRAWING

FIG. 1 illustrates a resitively-heated reactor and an electrically-cooled substrate, both contained within a vacuum chamber, in accordance with the present invention.

BEST MODE FOR CARRYING OUT THE INVENTION

According to the method of the present invention for forming a PA-F polymer, a mixture of TFB and a halogen initiator are provided to a low pressure reactor containing a metal catalyst. The reactor is operated at a sufficient temperature to form a reactive monomer by a chemical reaction at the surface of the catalyst. The reactive monomer is then condensed on the surface of a substrate cooled to a temperature sufficient to induce polymerization of the reactive monomer to form a PA-F polymer film.

In the preferred embodiment, the halogen initiator is DBX. However, it is expected that many other compounds can act as the halogen initiator according to the present invention. For example, it is expected that copper bromide (CuBr$_2$), or $\alpha, \alpha'$-dibromo-p-xylene (C$_6$H$_4$(CH$_2$Br$_2$)$_2$) could also be used as halogen initiators. In general, it is believed that any compound that is chemically compatible and stable in a mixture with TFB under the process conditions herein described, and contains a bromine, fluorine or chlorine atom bonded with benzylic carbon atoms can be used as the halogen initiator.

The reaction chemistry of the present invention is not fully understood, but it is believed that the halogen initiators described above can be used with the present invention because they react with copper under the process conditions in a, as yet unknown, manner to generate active reaction sites which catalyze the formation of monomer molecules.

In general, the proportion of halogen initiator required is about 0.25 to 50% by volume relative to the total volume of the TFB/halogen initiator mixture. However, the proportion of initiator used may be greater than 50% in some cases, depending upon such issues as catalyst temperature and the particular initiator used. The reactor is operated at a temperature of about 200° to 700° C. and a pressure of less than about one torr. In other embodiments, though, the temperature may be greater, ranging up to, for example, about 900° C. The temperature used depends upon the reactivity of the catalyst and the halogen-containing activator. In addition, the surface of the substrate is maintained at a temperature of about −30° C. to room temperature, although this may vary depending upon the nature of the polymerizing monomer which is deposited.

In the preferred embodiment, the metal catalyst is copper, but many other metal catalysts can be used. For example, it is expected that the metal catalyst can be copper, zinc, magnesium, or mixtures thereof. Other catalysts that are expected to work according to the present invention include titanium, cadmium, silver, indium, tin, or aluminum.

The material used as a substrate for condensing the PA-F film is not critical. A great variety of substrate materials may be selected depending upon the particular application. In general, any solid materials such as metals, semiconductors, or insulators that can exist in a vacuum when being cooled according to the present invention may act as a substrate. For example, it is expected that the substrate can be aluminum, copper, silver, gold, silicon, germanium, silicon oxide, gallium arsenide, alumina, silicon carbide, aluminum nitride, glass, quartz, rubber, plastic or ceramic.

According to the preferred embodiment, when using a halogen initiator of dibromotetrafluoro-p-xylene (DBX), the preferred proportion of DBX is about 1 to 5% by volume relative to the total volume of the TFB/DBX mixture. In some cases, a proportion of about 0.25% is sufficient. Although, the preferred proportion of DBX is about 1 to 5%, the proportion of DBX used may be substantially greater. For example, in some applications, the proportion of DBX used may be about 25% or 50%. In general, there is substantially no upper limit on the proportion of DBX because DBX, even in the absence of TFB, will react with the metal catalyst to give PA-F. However, as the proportion of DBX increases, the cost of the formed PA-F is expected to increase because DBX is more expensive to manufacture than TFB.

The reactor, which is discussed further below, is preferably operated at a temperature of about 350° to 400° C. and contains a copper catalyst. In general, though, the reactor may be operated at a temperature of about 200° to 700° C. As the operating temperature increases, the PA-F film will incorporate some metal impurities coming out of the reactor, and the reaction will become more complicated and undesirable. For lower operating temperatures it is difficult to form sufficient reactive momomer molecules, and therefore, the PA-F film could be very thin and may contain unreacted precursors.

Also, in general the reactor is operated at a pressure of less than about one torr, and more preferably about 50 to 450 mtorr. Further, it is expected that even higher pressures may be used. However, the quality of the PA-F film decreases as pressure is increased above 500 mTorr.

The surface of the substrate where the PA-F is deposited must be maintained at a temperature that is sufficiently low to cause the reactive monomer formed in the reactor to condense and polymerize. This temperature will vary depending upon through-put rate, monomer pressure, the actual substrate's thermal conductivity, thickness and the method of cooling. When using DBX as the halogen initiator, the surface of the substrate is maintained at a temperature of generally about $-20°$ to $0°$ C., and more preferably of about $-15°$ to $-5°$ C. It has been found that the optimum surface temperature for PA-F deposition is about $-15°$ C. because the deposition rate is greatest. As the surface temperature decreases, more impurities may become incorporated into the PA-F film. On the other hand, as the temperature is increased, polymerization/condensation may cease if it rises above the minimum critical deposition temperature.

The structures of the chemicals used in the preferred embodiment are shown below for purposes of illustration. The chemical structure of TFB is as follows:

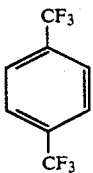

The chemical structure of DBX is as follows:

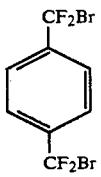

The chemical structure of PA-F is as follows:

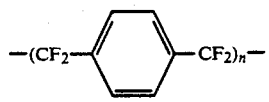

According to the preferred embodiment, the deposition time for forming PA-F films is typically less than about 30 minutes, and the PA-F films formed have a thickness of, for example, 0.12 to 1.5 microns. Further details regarding process conditions and results are described in the examples provided later.

An apparatus used to form a PA-F film according to the present invention is illustrated in FIG. 1. Referring to FIG. 1, a vacuum chamber 10 contains a reactor 12 and a substrate 14. Vacuum chamber 10 is of a conventional structure understood by those skilled in the art. Reactor 12 is constructed to withstand the temperature and pressure conditions described herein. A metal catalyst 16 is disposed in the interior of reactor 12. Reactor 12 is heated by a resistive heater 18, which is powered by a power supply 20. A heat shield 22 substantially surrounds the exterior of reactor 12.

A reactor supply tube 24 is connected to reactor 12. The reactants are stored in a storage container 26 and are fed to reactor 12 through reactor supply tube 24 as controlled by a control valve 28. Reactor 12 has an outlet 29. There is a cover (not shown) having, for example, three holes therein, which is used to seal the end of the reactor, over outlet 29 and a shutter 30, which is used as a heat shield, overlying the cover at outlet 29. The separation distance 32 between outlet 29 and shutter 30 is exaggerated for purposes of illustration. The purpose of the cover over outlet 29 is to maintain the temperature of the reactor, to prevent metal ions from escaping from the reactor at high temperature, to ensure that the reaction is substantially contained within the reactor, and to act as a diffuser. Acting as a diffuser, the cover enhances molecular collisions, which is important to the uniformity of the films. The purpose of shutter 30 is to block the heat from the reactor to the substrate. Also, it may be used to help control the flow rate through the reactor.

Substrate 14 is generally disposed about 25 cm above the top of the reactor, but the distance from and positioning relative to reactor 12 is not critical. In other embodiments the relative positions could be varied, and the substrate could be positioned anywhere in the vacuum chamber. However, it may need a diffuser to prevent the direct on-rush of hot monomer from the catalytic reactor, which could affect the condensation process and could lead to the formation of spherulites.

Substrate 14 is cooled using an electric cooling device 34. Device 34 is driven by a power supply 36 and operates using the well-known Peltier effect, but other cooling techniques can also be used. A heat exchanger 38 is used to remove heat from cooling device 34. A cooling water inlet 40 and outlet 42 are used to provide cooling water to exchanger 38.

It should be noted that some residual bromine from the catalytic reactor originating from the initiator may emerge into the deposition chamber becoming incorporated into the condensing PA-F film. This source of contamination can be mitigated by the use of an optional cooling trap designed to separate out the bromine while passing the PA-F monomer, which requires a substantially lower substrate temperature to condense. Other contaminants such as unreacted precursor or initiator may be similarly separated.

A port 44 is disposed on the bottom of vacuum chamber 10 and is connected to mechanical and diffusion vacuum pumps (not shown). The mechanical pump is used for removing most of the gas in the system to reach a low vacuum of about $10^{-3}$ Torr and the diffusion pump is used to attain a higher vacuum of about $10^{-6}$ Torr.

Storage container 26 is heated by a resistive heater (not shown) because a mixture of TFB and DBX is a liquid at room temperature. The temperature of the mixture is maintained at about 25° to 40° C. during deposition of a PA-F film. The temperature may be as high as 80° depending on the deposition pressure and the deposition rate. However, the particular temperature used is not important to the practice of the invention.

With respect to the starting materials required for forming PA-F, TFB is commercially available as a liquid that may be purchased from commercial chemical supply houses such as Aldrich Chemical Co., or PCR. However, DBX is not commercially available and, therefore, must be synthesized before combining with TFB. However, the synthesis of DBX is known as described by Chow et al., Journal of Organic Chemistry, vol. 35 (1970), pp. 20-22; and W. R. Hertler, Journal of Organic Chemistry, vol. 28 (1963), pp. 2877-2879. Both of these articles are intended to be incorporated in full by reference. In the preferred embodiment, DBX is synthesized as described below.

The two-step process for the synthesis of DBX is illustrated below:

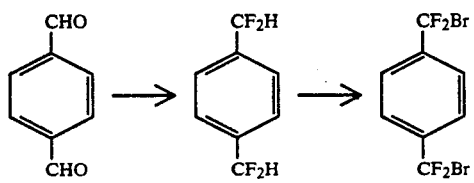

In the first step, terephthalaldehyde, which is commercially available, is reacted with sulfur tetrafluoride ($SF_4$) at 150° C. and 8.4 MPa to give $\alpha,\alpha,\alpha',\alpha'$-tetrafluoro-p-xylene. In the second step $\alpha,\alpha,\alpha',\alpha'$-tetrafluoro-p-xylene is brominated by photolysis using, for example, a Hg lamp in carbon tetrachloride ($CCl_4$) in the presence of N-bromosuccinimde (NBS). The chemical yield is about 85 to 87% in the first step and about 43 to 45% in the second step. This bromination yields a mixture of mono- and di-brominated materials along with unreacted $\alpha,\alpha,\alpha',\alpha'$-tetrafluoro-p-xylene. The DBX is purified before use in PA-F deposition. The mono-brominated product may be separated and re-treated with NBS and ultraviolet light to increase the process efficiency. For purposes of more complete description, a specific example of the second step in the formation of DBX is given below.

In the second step of the formation of DBX, the following chemicals are placed into a quartz tube (45 cm long, 57 mm ID, 61 mm OD):

| | |
|---|---|
| $\alpha,\alpha,\alpha',\alpha'$-tetrafluoro-p-xylene | 113 g |
| N-bromosuccinimde (NBS) | 330 g |
| Carbon tetrachloride ($CCl_4$) | 1.5 kg |
| Azobisisobutyronitrile (ALBN) | 1% by weight |

The quartz tube is placed into a photo reactor, which is commercially available. The tube is heated electrically to about 70° C. and then exposed to UV light from a Hg lamp for 48 hours. A condenser is used to trap the gas that exits the end of the tube. A small amount of escaped gas is vented to the hood.

Following the above photo-reaction, the liquid remaining in the tube is filtered using filter paper to remove solid particles. The $CCl_4$ is separated using a rotary-evaporator at a temperature of 40° C. Standard chromography is used to purify the DBX. The last step of this purification is to filter any silica gel remaining in the DBX using pentane as the solvent. Following filtering of the silica gel, pentane ($C_5H_{12}$) is separated using a rotary-evaporator.

The present invention is further illustrated in the examples given below. These examples are provided for the purpose of description, and the details provided therein are not intended to limit the scope of the present invention.

EXAMPLE 1

The reactor was prepared by filling it with copper turnings, which are commercially available from Fisher Scientific Company. Next, the shutter of the reactor was closed, and the substrate was mounted onto the substrate cooling system. The vacuum chamber was sealed and evacuated using mechanical and diffusion pumps in the following way: first, the deposition chamber was evacuated using the mechanical pump to about $10^{-3}$ torr; next, the diffusion pump was used to further reduce the pressure in the chamber.

Five grams of TFB (commercially available from Aldrich) were mixed with 1% (by volume) of DBX, and the mixture was put into the storage container (note: the proportion of DBX in the mixture was 3% by volume relative to the total volume of the mixture).

The vacuum chamber was evacuated to a base pressure of $10^{-6}$ torr. Next, the resistive heater and electric cooling device were activated. After the reactor reached a temperature of 310° C., the storage container's resistive heater was activated. The reactor was further heated until it reached a temperature of about 390° C. When the mixture in the storage container was about 40° C., the vacuum valve between the chamber and the vacuum pumps was closed.

Next, the shutter was opened followed by the opening of the control valve to the storage container. A vapor from the storage container mixture entered the reactor which was maintained at a temperature of 370° C. during deposition by using resistive heating. Also, during deposition the chamber pressure was 500 mtorr because of the controlled heating of the storage container. The substrate temperature was −10° C. The deposition time was measured from the opening of the control valve and was 30 minutes. The deposited PA-F film had a thickness of 0.3-1.5 microns.

EXAMPLE 2

The same procedure as in Example 1 above was followed with the following exceptions: Five grams of TFB were mixed with 3% (by volume) of DBX and then added to the storage container. The reaction temperature was 330° to 370° C., and the substrate temperature was −5° C. during the deposition. The temperature of the TFB/DBX mixture in the storage container during deposition was 40° C. The deposition pressure was 400 mtorr and the deposition time was 20 minutes. PA-F films were formed having a thickness of 0.2 to 0.5 μm.

EXAMPLE 3

The same procedure as in Example 1 above was followed with the following exceptions: Five grams of TFB were mixed with 5% (by volume) of DBX and then added to the storage container. The reaction temperature was 320° to 380° C., and the substrate temperature of the TFB/DBX mixture in the storage container during deposition was 45° C. The deposition pressure was 500 mtorr and the deposition time was 20 minutes. PA-F films were formed having a thickness of about 0.7 μm.

EXAMPLE 4

The same procedure as in Example 1 above was followed with the following exceptions: Five grams of TFB were mixed with 3% (by volume) of DBX and then added to the storage container.

The upper cover of the reactor, which had three holes, was removed before closing the shutter (the upper cover was removed to permit a very fast deposition). The reaction temperature was 330° to 360° C., and the substrate temperature was −10° C. during the deposition. The temperature of the TFB/DBX mixture in the storage container during deposition was 65° C. The deposition pressure was 500 to 800 mtorr and the deposition time was 7 minutes. PA-F films were formed having a thickness of 0.9 to 1.5 microns.

There are several advantages to the present invention over the prior art. For example, X-ray photoelectron spectroscopy (XPS) data have shown that the PA-F films made according to the method of the present invention generally have lower impurity concentrations than those made using a PA-F dimer, as in, for example, the Gorham method described above. Although PA-F films according to the present invention may have higher concentrations of incorporated bromine than films made using a PA-F dimer, the bromine-containing impurities can be driven off by annealing, for example, under $N_2$ at a temperature of about 300° C. for a time period of about 30 minutes.

Another advantage is that the process according to the present invention requires less time and effort in the synthesis of intermediates (note: the process is catalytic and has not yet been optimized).

PA-F films formed by the present invention have a substantially identical Fourier Transform Infrared (FTIR) spectra and X-ray Photoelectron Spectroscopy (XPS) features as films made using the dimer. The melting temperature of films according to the present invention is 530° C., which is same as that of PA-F films. Also, the electrical properties of the deposited PA-F films made from dimer according to the present invention are comparable to those of made from conventional method by using the dimer.

Although the present invention has been described in detail above, it is not intended to be limited to the specific form set forth herein, but, on the contrary, it is intended to cover such alternatives and equivalents as can reasonably be included within the spirit and scope of the invention as defined by the appended claims.

For example, in other embodiments according to the present invention, an inert gas such as Argon could be combined with the TFB/halogen initiator mixture provided to the reactor.

Also, the reactor and substrate do not have to be contained within the same vacuum chamber housing and instead could be connected in consecutive stages, each operating independently with variable parameters and connected by tubing.

We claim:

1. A process for forming a parylene-F (PA-F) polymer, comprising the steps of:
   reacting a mixture of 1,4-bis(trifluoromethyl) benzene (TFB) and a halogen initiator in the presence of a metal catalyst at a temperature sufficiently high to form a reactive monomer; and
   forming said PA-F polymer on a surface of a substrate maintained at a temperature sufficiently low to induce polymerization of said reactive monomer.

2. The process of claim 1 wherein the proportion of said halogen initiator is about 0.25 to 50% by volume relative to the total volume of said mixture.

3. The process of claim 1 wherein said halogen initiator comprises bromine, fluorine, or chlorine.

4. The process of claim 1 wherein said halogen initiator comprises DBX, copper bromide, or α, α'-dibromo-p-xylene.

5. The process of claim 1 wherein said metal catalyst comprises copper, zinc, magnesium, titanium, cadmium, silver, indium, tin, or aluminum.

6. The process of claim 1 wherein said step of reacting comprises reacting at a temperature of about 200° to 700° C.

7. The process of claim 1 wherein said step of reacting comprises reacting at a pressure of less than about one torr.

8. The process of claim 1 wherein said substrate comprises aluminum, silicon, copper, gallium arsenide, glass, or quartz.

9. The process of claim 1 wherein said step of forming said PA-F polymer comprises maintaining said surface of said substrate at a temperature of about −30° C. to room temperature.

10. A process for forming a parylene-F (PA-F) polymer, comprising the steps of:
    reacting a mixture of 1,4-bis(trifluoromethyl) benzene (TFB) and dibromotetrafluoro-p-xylene (DBX), the proportion of the DBX in said mixture being greater than about 0.25% by volume relative to the total volume of said mixture, in the presence of a metal catalyst at a temperature of less than about 400° C.; and
    forming said PA-F polymer on a surface of a substrate, said surface maintained at a temperature less than about 0° C.

11. The process of claim 10 wherein the proportion of the DBX in said mixture is about 1 to 5% by volume relative to the total volume of said mixture.

12. The process of claim 10 wherein said metal catalyst comprises copper.

13. The process of claim 10 wherein said step of reacting comprises reacting at a pressure of about 50 to 450 mtorr.

14. The process of claim 10 wherein said substrate comprises aluminum, silicon, copper, gallium arsenide, glass, or quartz.

15. The process of claim 10 wherein said step of forming said PA-F polymer comprises maintaining said surface of said substrate at a temperature of about −20° to 0° C.

16. A process for forming a parylene-F (PA-F) polymer, comprising the steps of:
    reacting a mixture of 1,4-bis(trifluoromethyl) benzene (TFB) and dibromotetrafluoro-p-xylene (DBX), the proportion of the DBX in said mixture being about 1 to 5% by volume relative to the total volume of said mixture, in the presence of a metal catalyst at a temperature of about 350° to 400° C. and at a pressure of about 50 to 450 mtorr; and
    forming said PA-F polymer on a surface of a substrate, said surface maintained at a temperature of about −15° to −5° C.

17. The process of claim 16 wherein said substrate comprises aluminum, silicon, copper, gallium arsenide, glass, or quartz.

18. The process of claim 16 wherein said step of forming said PA-F polymer comprises forming said PA-F polymer in a vacuum chamber.

19. The process of claim 16 further comprising the step of supplying said mixture at a temperature of about 25° to 40° C.

20. The process of claim 16 wherein said step of forming said PA-F polymer on said surface comprises forming a PA-F polymer film having a thickness of about 0.2 to 2.0 microns.

21. The process of claim 16 wherein said step of forming said PA-F polymer comprises deposition for a time period of less than about 30 minutes.

22. The process of claim 16 wherein said metal catalyst comprises copper.

* * * * *